(12) United States Patent
Schwabe

(10) Patent No.: US 6,760,682 B1
(45) Date of Patent: Jul. 6, 2004

(54) POSITION-MEASURING DEVICE

(75) Inventor: Michael Schwabe, Rimsting (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 10/048,828

(22) PCT Filed: Aug. 3, 2000

(86) PCT No.: PCT/EP00/07511

§ 371 (c)(1),
(2), (4) Date: Jun. 4, 2002

(87) PCT Pub. No.: WO01/09568

PCT Pub. Date: Feb. 8, 2001

(30) Foreign Application Priority Data

Aug. 3, 1999 (DE) ......................................... 199 36 582

(51) Int. Cl.[7] .............................. G01B 7/02; G06F 11/06
(52) U.S. Cl. ................... 702/150; 324/207.17; 714/799
(58) Field of Search ......................... 702/94, 150, 151; 341/15, 98; 250/231.16, 231.18, 237; 356/373, 374, 623; 324/207.17; 714/799, 812

(56) References Cited

U.S. PATENT DOCUMENTS

| | | | |
|---|---|---|---|
| 4,502,143 A | | 2/1985 | Kato et al. .................. 714/812 |
| 4,618,849 A | | 10/1986 | Bruestle ....................... 341/98 |
| 5,068,529 A | | 11/1991 | Ohno et al. ............. 250/231.18 |
| 5,173,693 A | | 12/1992 | Fry ............................. 341/15 |
| 5,687,103 A | * | 11/1997 | Hagl et al. .................. 702/150 |
| 5,691,814 A | * | 11/1997 | Strasser ...................... 356/623 |
| 5,754,568 A | * | 5/1998 | Braasch ....................... 714/799 |
| 6,054,851 A | * | 4/2000 | Masreliez et al. ..... 324/207.17 |

FOREIGN PATENT DOCUMENTS

| | | |
|---|---|---|
| DE | 32 14 150 | 12/1985 |
| DE | 39 42 625 | 6/1990 |
| DE | 43 09 881 | 5/1994 |
| EP | 0 368 605 | 5/1990 |
| JP | 3-296620 | 12/1991 |
| WO | WO 98/13669 | 4/1998 |

OTHER PUBLICATIONS

G.H. Tomlinson, "Absolute–Type Shaft Encoder Using Shift Register Sequences," Electronics Letters, vol. 23, No. 8, Apr. 9, 1987, pp. 398–400.

J.T.M. Stevenson et al., "Absolute Position Measurement Using Optical Detection of Coded Patterns," Journal of Physics E/Scientific Instruments vol. 21, No. 12, 1988, pp. 1140–1145.

Stefan Götze, "Sequentielle und Zyklisch–Sequentielle Codierung für Winkel–und Längenmessungen," Technisches Messen, vol. 61, No. 9, Sep. 1994, pp. 343–345.

* cited by examiner

Primary Examiner—John Barlow
Assistant Examiner—John H Le
(74) Attorney, Agent, or Firm—Brinks Hofer Gilson & Lione

(57) ABSTRACT

A position measuring device that includes a scanning device and a measurement representation that is scanned by the scanning device. The measurement representation includes a code of a succession of code elements, which form at least a first codeword and a second codeword that define an absolute position, the first codeword and the second codeword are arranged interlaced with each other in that code elements associated with the second codeword are inserted into a succession of code elements associated with the first codeword. The code elements associated with the first codeword have inverse properties with respect to the code elements associated with the second code codeword.

16 Claims, 1 Drawing Sheet

POSITION-MEASURING DEVICE

Applicant claims, under 35 U.S.C. §§ 120 and 365, the benefit of priority of the filing date of Aug. 3, 2000 of a Patent Cooperation Treaty patent application, copy attached, Ser. No. PCT/EP00/07511, filed on the aforementioned date, the entire contents of which are incorporated herein by reference, wherein Patent Cooperation Treaty patent application Serial Number PCT/EP00/07511 was not published under PCT Article 21(2) in English.

Applicant claims, under 35 U.S.C. § 119, the benefit of priority of the filing date of Aug. 3, 1999 of a German patent application, copy attached, Ser. No. 199 36 582.2, filed on the aforementioned date, the entire contents of which are incorporated herein by reference.

BACKGROUND OF THE INVENTION

FIELD OF THE INVENTION

The present invention relates to a position measuring device with a measurement representation and a scanning device for scanning the measurement representation.

Position measuring devices with a single-track absolute code, also called chain code or pseudo-random code, are increasingly being accepted. There, the measurement representation includes a code track with code elements of equal width arranged one behind the other in the measuring direction. The code elements are provided in accordance with a pseudo-random distribution, so that a defined number of sequential code elements respectively form a codeword, and all code elements a continuous sequence of different codewords. A new codeword, which unequivocally defines an absolute position, is already pending after a displacement path corresponding to the width of a code element. Such a position measuring device is extensively described in DE 39 42 625, for example.

It is disadvantageous here that there are relatively long areas with identical properties in connection with a relatively long measurement representation, i.e. with a large measuring area. If, for example, the position measuring device is a magnetic measuring device, the code elements include north and south poles. An area with many codewords of identical magnetization creates a continuous field, which makes evaluation more difficult and affects a measurement representation extending adjacent to it, in particular an incremental graduation, in an undesired manner.

It is pointed out in the literature by Stevenson J T M and Jordan J R: Absolute position measurement using optical detection of coded patterns, Journal of Physics E. Scientific Instruments, GB, IOP publishing, Bristol, vol. 21, No. 12, 1 Dec. 1988, pages 1140 to 1145, and Göze S: Sequentielle und zyklisch-sequentielle Codierung für Winkel -und L ängeniessungen [Sequential and Cyclic-Sequential Coding for Angle and Linear Measurements], Technisches Messen [Technical Measuring], R. Oldenbourg, publ., München, vol. 61, No. 9, Sep. 1, 1994, pages 343 to 345, that several partial codes can be arranged interlaced. Because of this it is possible to increase the distance between the scanning elements.

It was recognized in DE 43 09 881 C1 that it can be disadvantageous if several code elements with identical properties are arranged directly next to each other. For this reason the distribution of the code elements is inversely repeated. The position information is formed from the signal difference.

The position measuring device has the disadvantage that the actual position information is redundantly present in the code track and that therefore the opportunity of providing different codewords on a preset measuring length is reduced.

The position measuring device in accordance with JP 3-296620, in which following each codeword the inverse codeword with respect to it is applied in the measuring direction, has the same disadvantage.

It is known from EP 368 605 B1 to divide a piece of digital position information into two or more fragments of approximately the same length. To store this piece of position information on a graduation, the first bit of the first fragment, then the first bit of the second fragment, down to the first bit of the last fragment, are stored on the graduation. Subsequently, the second bit of the second fragment, then the second bit of the second fragment, down to the second bit of the last fragment, are stored on the graduation. This is repeated until the entire position information is stored. Because of this, the position information of the individual fragments is interleaved. But it is not yet assured by this that the fewest number of code elements is arranged in direct succession in the measuring direction.

It is therefore an object of the present invention to disclose a position measuring device in accordance with which it is intended to avoid a plurality of successive code elements with identical properties, while still being able to code a large meaement area absolutely.

This object is attained by a position measuring device that includes a scanning device and a measurement representation that is scanned by the scanning device. The measurement representation includes a code of a succession of code elements, which form at least a first codeword and a second codeword that define an absolute position, the first codeword and the second codeword are arranged interlaced with each other in that code elements associated with the second codeword are inserted into a succession of code elements associated with the first codeword. The code elements associated with the first codeword have inverse properties with respect to the code elements associated with the second code codeword.

The position measuring device in accordance with the present invention has the advantage that only a few adjoining code elements have identical properties.

The present invention will be explained in greater detail in what follows by the drawings, Lawn is in:

DESCRIPTION OF THE PREFERRED EMBODIMENT(S) OF THE INVENTION

Figure 1:
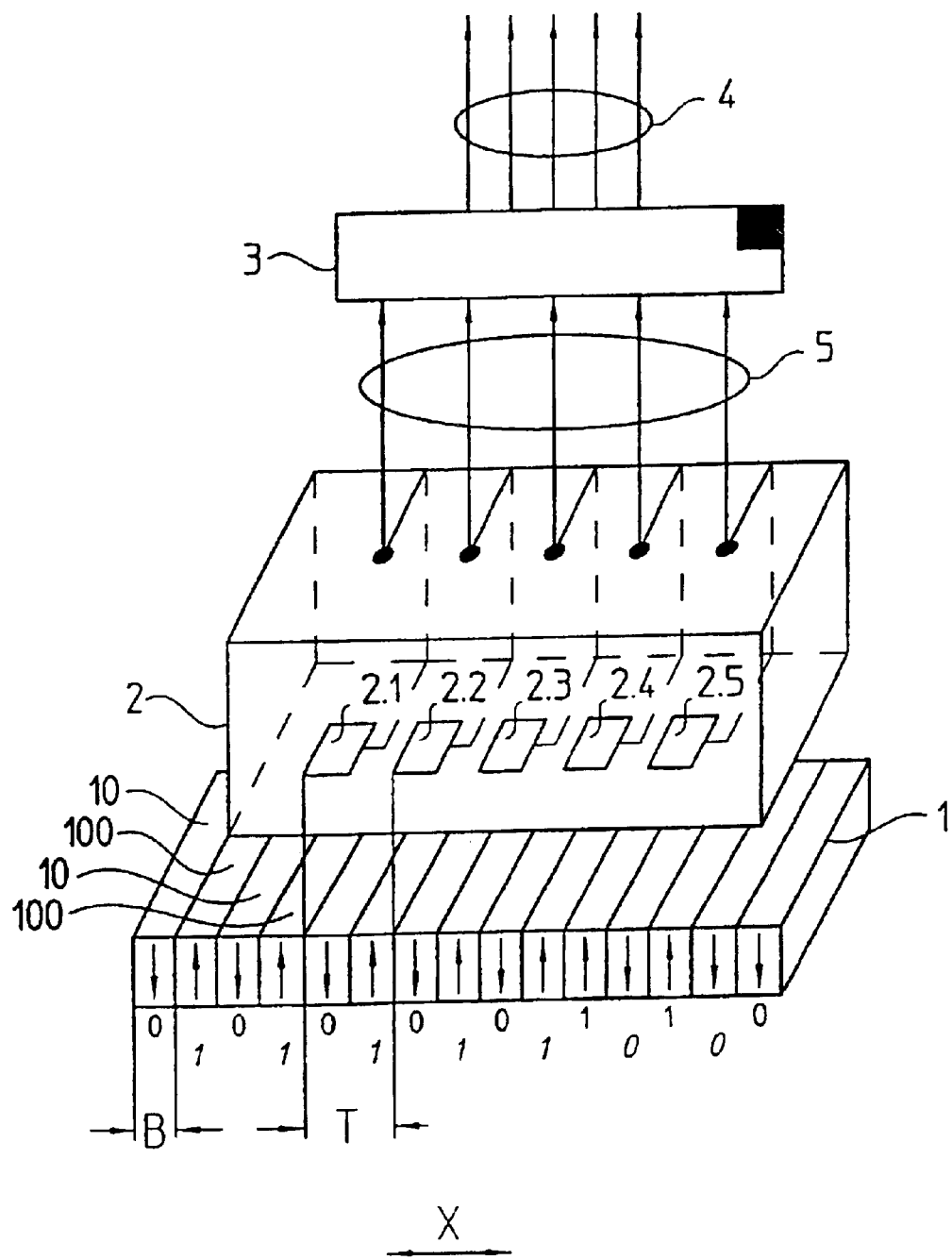
FIG. 1 shows a perspective view of an embodiment of a position measuring device in accordance with the present invention with a single-track magnetic measurement representation.

The present invention will be explained by FIG. 1 and Tables 1 and 2 and an example, wherein a measurement representation 1 with magnetic code elements 10, 100 is scanned by a scanning device 2. The code elements 10, 100 are magnetic poles of different magnetization, which is schematically represented by the direction of the arrows.

The absolute position 4 is unequivocally determined by using a single-track code of a width of the codewords of five code elements. Based on binary coding in accordance with the dual system of a codeword width of five code elements 10, a customary serial code is defined by a succession of code elements 10 (physical succession) in accordance with Table 1. This code is also called chain code or pseudo-random code. For example, a code element identified by "0" is a south pole, and a code element identified by "1" a north pole, thus the north pole has an inverted property with respect to the south pole.

With a code width of five code elements 10 it is possible to form thirty-two different codewords, which in turn can code thirty-two different absolute positions 4. It can be seen in Table 1, that the sequence of the code elements 10 has been selected in such a way that, with a displacement of the scanning unit 2 by a width B of a code element 10, an unequivocal, i.e. different from the remaining codewords, codeword is again present.

TABLE 1

| Physical Sequence | 0 0 0 0 0 1 1 0 0 0 1 0 1 0 0 1 |
|---|---|
| First Codeword | 0 0 0 0 0 |
| Second Codeword | 0 0 0 0 1 |
| Third Codeword | 0 0 0 1 1 |
| Fourth Codeword | 0 0 1 1 0 |
| Fifth Codeword | 0 1 1 0 0 |
| Sixth Codeword | 1 1 0 0 0 |
| * * * | * * * |

The succession of the code elements 10 in Table 1 has repeatedly directly successive code elements 10 with identical properties, in the example identical magnetization. Thus, the first five code elements 10 are respectively identical. This relative large homogeneous area extending in the measuring direction X generates a large continuous field, which can lead to undesired effects, in particular on an incremental adjoining track, or makes the optimal design of the scanning device 2 more difficult,.

So that the smallest possible number of successive code elements 10 have identical properties, in accordance with the present invention the code element 100, which is the inverse of the code element 10, is inserted into the sequence of code elements following each code element 10, which is represented in Table 2 for the same section of the code sequence as in Table 1. Thus, codewords and inverted codewords are interlaced with one another as shown in Table 2. Inverted code elements 100 are cursively represented. It is also possible here to interchange the sequence of original and inverted code elements 10, 100, so that fist the inverted code element and then the original code element 10, 100 is arranged in the code sequence. The original code elements 10, and the code elements 100 inverted with respect to them, which are respectively in the same position in the codeword, are arranged following each other in alternation. The sequence of code elements 10, 100 created in this way is represented in Table 2.

TABLE 2

| Physical Sequence | 0 1 0 1 0 1 0 1 0 1 1 0 1 0 0 1 0 1 0 1   1 0 0 1 1 0 0 1 0 1   1 0 |
|---|---|
| 1st Codeword | 0 0 0 0 0 |
| 1st Codeword inverted | 1 1 1 1 1 |
| 2nd Codeword | 0 0 0 0 1 |
| 2nd Codeword inverted | 1 1 1 1 0 |
| 3rd Codeword | 0 0 0 1 1 |
| 3rd Codeword inverted | 1 1 1 0 0 |
| 4th Codeword | 0 0 1 1 0 |
| 4th Codeword inverted | 1 1 0 0 1 |
| 5th Codeword | 0 1 1 0 0 |
| 5th Codeword inverted | 1 0 0 1 1 |
| Sixth Codeword | 1 1 0 0 0 |
| * * * | * * * |

By providing the respectively inverted code element 100 following an original code element in the physical sequence on the measurement representation 1 it is assured, that maximally two successive code elements 10, 100 have identical properties, for example identical magnetization. The code elements 10, 100 also have the same width. Since it is also possible to unequivocally detect a codeword, and therefore an absolute position 4 from the inverted code elements 100, the information which can be maximally coded on the basis of the number of code elements 10, 100 per codeword is fully utilized.

The scanning device 2 contains five detector elements 2.1, 2.2, 2.3, 2.4, 2.5, which are respectively arranged at a mutual distance T between two code elements 10, 100, for scanning the code elements 10, 100 of the measurement representation 1. By this it is assured that a codeword is derived either exclusively from original code elements 10, or exclusively from inverted code elements 100, since all detector elements 2.1 to 2.5 are placed opposite of either the original or the inverted code elements 10, 100.

The scanning signals of the detector elements 2.1 to 2.5 are used in a manner known per se for addressing a memory 3. The scanning signals 5 are recoded into absolute positions 4 in the memory 3.

Thus, in the physical sequence of the code elements 10, 100 in accordance with Table 2, in the first position the first codeword (00000) is decoded as the first absolute position 4, if the scanning device 2 moves on by one code element 10, 100, namely by B, the "1st Codeword inverted" (11111) is decoded as the second absolute position 4, if the scanning device 2 moves on by a further code element, the 2nd codeword (00001) is decoded as the third absolute position 4, if the scanning device 2 moves on by a further code element, the "2nd Codeword inverted" (11110) is decoded as the fourth absolute position 4.

The sequence of the codes represented in Table 2 includes two rows of codewords, wherein one row of codewords constitutes a single-step code which, however, only has half the numerical space (with 5 bits: 16 codewords) corresponding to the bit length of a codeword of the row of codewords. These code words are different, and none of the codeword is the inverse of one of the other codewords.

The second row of codewords has been created by inverting the code elements of the codewords of the first row, and it constitutes the further half of the numerical space corresponding to the bit length of a codeword of the second row of codewords.

Note that the above example with respect to Table 2 is based on the knowledge that it is possible to form a limited number $2^M$ of different code words from a defined number M of code elements that constitute a code word. For example, if each code word has a length of 5 bits (M=5), the maximum number of different code words that can be formed will be 32 ($2^5$). Thus, the entire unequivocal numerical space of a code of a preset bit length M is fixed in advance by $2^M$. Within this maximum numerical space, i.e., the maximum number of possible option of arranging the bits, an inverse code word is found for each code word. When completely utilizing the available numerical space, a first row of code words must therefore be arranged in such a way that none of the code words therein is the same as an inverted code word of any arbitrary code word in this first row. Fully utilizing the available possibilities, the sequence of the available options includes half the numerical space (i.e., half of all options). The second row is generated by inverting the bits in the first row. As explained below, the entire code is formed by interleaving the first and second rows. The entire available numerical space can only be used in this way or, in other words, only in this way are all options for generating different code words available.

The frequency of an arrangement of identical code elements 10, 100 can also be reduced if the respective inverted code elements 100 are not inserted immediately following the unchanged code element 10, but only after one or several code elements 10. If it is assumed that a codeword respectively includes M>1 code elements, it is possible to insert N code elements of N further codewords between respectively two code elements 10 of a first codeword, wherein 0<N<M. In order to achieve a change of the properties of the code elements 10, 100 in the sequence, the code elements 100 of one of the inserted codewords are designed to be inverse with respect to the code elements 10 of the first codeword.

To form the absolute position 4, the mutual distance T of the detector elements of the scanning device 2 is (N+1) times the width B of a code element 10, 100. Thus, in the case of N=1, the mutual distance T is twice the width of the code elements 10 100.

The present invention can be employed with linear and angular measuring devices. When used with angular measuring devices, the employment of closed rows of codewords is advantageous. In this case, it is possible to connect the end of one row of codewords seamlessly with its start. A definite absolute position can also be detected in the transition area between the start and the end. The code elements can be arranged symmetrically with respect to the axis of rotation on a disk or at the circumference of a drum.

The present invention can be employed particularly advantageously with M being greater than 7, and N equal to 1.

The advantages of the present invention result in a particularly obvious manner in connection with a magnetic measurement representation, wherein the code elements 10, 100 include magnetic poles of equal width B. In this case, the magnetic poles can be provided on the basis of magnets embedded in plastic material, or metallic, or ceramic hard magnets. The detector elements 2.1 to 2.5 are advantageously Hall elements, however, magneto-resistive sensors or sensors with great magnetic resistance can also be employed.

But the present invention can also be advantageously employed with optical, capacitive or inductive position measuring devices. With optical position measuring devices the code elements include transparent, or respectively reflective, areas and non-transparent, or non-reflective, areas of the same width B, which are inverted with respect to the former.

The property, which was defined as inverse above can also be called complementary, wherein as a function of the physical scanning principle the code element 10 and the code element 100, which is inverse with respect to it, have complementary physical properties—in the example opposite directions of magnetization.

In a manner not shown it is advantageous to arrange a periodic incremental graduation next to the sequence of code elements 10, 100, so that in accordance with known interpolation methods it is possible to indicate the position of the scanning device 2 with respect to the measurement representation 1 with a high degree of resolution even inside of a code element 10, 100.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

What is claimed is:

1. A position measuring device comprising:

a scanning device; and a measurement representation that is scanned by said scanning device, wherein said measurement representation comprises:

a code of a succession of code elements, which form at least a first codeword and a second codeword that define an absolute position, said first codeword and said second codeword are arranged interlaced with each other in that code elements associated with said second codeword are inserted into a succession of code elements associated with said first codeword; and said code elements associated with said first codeword have inverse properties with respect to said code elements associated with said second code codeword.

2. The position measuring device in accordance with claim 1, wherein the number M of said code elements associated with said first codeword is greater than one and one code element associated with said second codeword is inserted between respectively two code elements associated with said first codeword.

3. The position measuring device in accordance with claim 2, wherein said scanning device comprises M detector elements for scanning said code elements associated with said first codeword and said second codeword and for forming a codeword, and a mutual distance between said M detector elements twice a width of a code element associated with either said first codeword or said second codeword.

4. The position measuring device in accordance with claim 3, wherein said width of said code element associated with said first codeword is equal to said width of said code element associated with said second codeword.

5. The position measuring device in accordance with claim 4, wherein M is greater than or equal to 8.

6. The position measuring device in accordance with claim 3, wherein M is greater than or equal to 8.

7. The position measuring device in accordance with claim 3, wherein said code elements associated with said first codeword and said second codeword comprise magnetic poles, and said M detector elements comprise Hall elements.

8. The position measuring device in accordance with claim 2, wherein M is greater than or equal to 8.

9. The position measuring device in accordance with claim 2, wherein said code elements associated with said first codeword and said second codeword comprise magnetic poles, and said M detector elements comprise Hall elements.

10. The position measuring device in accordance with claim 1, wherein said code elements associated with said first codeword and said second codeword comprise magnetic poles, and said scanning device comprises Hall elements.

11. A position measuring device comprising:

a scanning device; and a measurement representation that is scanned by said scanning device, wherein said measurement representation comprises:

a code of a succession of code elements, which form at least a first codeword and a second codeword that define an absolute position, said first codeword and said second codeword are arranged interlaced with each other in that code elements associated with said second codeword are inserted into a succession of code elements associated with said first codeword; and said code elements associated with said first codeword have inverse properties with respect to said code elements associated with said second code codeword, wherein the number M of said code elements associated with said first codeword is greater than one and N code elements associated with said N number of codewords are inserted between respectively two code elements associated with said first codeword, wherein 0<N<M.

12. The position measuring device in accordance with claim 11, wherein said scanning device comprises M detector elements for scanning said code elements associated with said first codeword and said N number of codewords and for forming a codeword, and a mutual distance between said M detector elements for forming said codeword is (N+1) times a width of either said code elements associated with said first code word or associated with said N codewords.

13. The position measuring device in accordance with claim 12, wherein said width of said code elements associated with said first codeword is equal to said width of said code elements associated with said N codewords.

14. The position measuring device in accordance with claim 12, wherein said code elements associated with said first codeword and said second codeword comprise magnetic poles, and said M detector elements comprise Hall elements.

15. The position measuring device in accordance with claim 11, wherein said code elements associated with said first codeword and said second codeword comprise magnetic poles, and said M detector elements comprise Hall elements.

16. A position measuring device comprising:
a scanning device; and
a measurement representation that is scanned by said scanning device, wherein said measurement representation comprises:
  a code of a succession of code elements, which form at least a first codeword and a second codeword that define an absolute position, said first codeword and said second codeword are arranged interlaced with each other in that code elements associated with said second codeword are inserted into a succession of code elements associated with said first codeword; and
  said code elements associated with said first codeword have inverse properties with respect to said code elements associated with said second code codeword, wherein said code comprises two interlaced rows of codewords, wherein one of said two interlaced rows of codewords comprises a single-step code, which includes a first half of a numerical space corresponding to a bit length of a codeword associated with said one of said two interlaced Tows of codewords, and wherein said other of said two interlaced rows of codewords comprises inverted code elements of said one of said two interlaced rows of codewords and further comprises a second half of said numerical space corresponding to a bit length of a codeword associated with said other of said two interlaced rows of codewords.

* * * * *